United States Patent
Keaveney et al.

(10) Patent No.: US 7,202,717 B2
(45) Date of Patent: Apr. 10, 2007

(54) CHOPPED CHARGE PUMP

(75) Inventors: Michael F. Keaveney, Lisnagry (IE); William Hunt, Castletroy (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/874,720

(22) Filed: Jun. 23, 2004

(65) Prior Publication Data

US 2005/0017776 A1 Jan. 27, 2005

Related U.S. Application Data

(60) Provisional application No. 60/544,439, filed on Feb. 14, 2004, provisional application No. 60/483,411, filed on Jun. 27, 2003.

(51) Int. Cl.
*H03L 7/089* (2006.01)
(52) U.S. Cl. .................. 327/157; 331/34; 375/374
(58) Field of Classification Search ............. 327/148, 327/147, 156, 157; 375/374–376; 331/1 A, 331/8, 17, 25, 34
See application file for complete search history.

(56) References Cited

U.S. PATENT DOCUMENTS

| | | | |
|---|---|---|---|
| 4,156,855 A | 5/1979 | Crowley | 331/1 A |
| 5,801,578 A * | 9/1998 | Bereza | 327/536 |
| 6,043,716 A * | 3/2000 | Warner | 331/17 |
| 6,075,406 A * | 6/2000 | Lee et al. | 327/538 |
| 6,111,470 A | 8/2000 | Dufour | 331/17 |
| 6,169,458 B1 * | 1/2001 | Shenoy et al. | 331/17 |
| 6,222,402 B1 * | 4/2001 | Boerstler et al. | 327/157 |
| 6,385,265 B1 * | 5/2002 | Duffy et al. | 375/374 |
| 6,466,070 B1 * | 10/2002 | Ross | 327/157 |
| 6,727,735 B2 * | 4/2004 | Park | 327/157 |
| 7,042,261 B2 * | 5/2006 | Lee et al. | 327/157 |

OTHER PUBLICATIONS

Rhee, W., "Design of High-Performance CMOS Charge Pums in Phase-Locked Loops", IEEE International Symposium on Circuits and Systems (ISCAS) 1999, vol. 2, pp. 545-548.
"An Analysis and Performance Evaluation of a Passive Filter Design Technique for Charge Pump PLL's", National Semiconductor Application Note 1001, Jul. 2001, pp. 1-8.
Byrd, et al. "A Fast Locking Scheme for PLL Frequency Synthesizers", National Semiconductor Application Note 1000, Jul. 1995, pp. 1-6.
Curtin et al., "Phase Locked Loops for High-Frequency Receivers and Transmitters-Part 3", Analog Dialogue 33-7 (1999), pp. 1-5.
Rhee et al., "A 1.1-GHz CMOS Fractional-$N$ Frequency Synthesizer with a 3-b Third-Order Delta Sigma Modulator"; IEEE Journal of Solid-State Circuits, vol. 35, No. 10, Oct. 2000, pp. 1453-1460.
Gresbishchev et al., "SiGe Clock and Data Recovery IC with Linear-Type PLL for 10-Gb/s SONET Application"; IEEE Journal of Solid-State Circuits, vol. 35, No. 9, Sep. 2000, pp. 1353-1359.
Bastos et al., "A 12-Bit Intrinsic Accuracy High-Speed CMOS DAC"; IEEE Journal of Solid-State Circuits, Vo. 33, No. 12, Dec. 1998, pp. 1959-1969.

* cited by examiner

*Primary Examiner*—Timothy P. Callahan
*Assistant Examiner*—Terry L. Englund
(74) *Attorney, Agent, or Firm*—Iandiorio & Teska

(57) ABSTRACT

A chopped charge pump with matching up and down pulses including a first pair of current sources, a second pair of current sources, and a switching circuit for switching on in a first phase one current source of each pair to provide up current pulses, and the other current source of each pair to provide down current pulses, and switching on in a second phase the other current source of each pair to provide up current pulses, and the one current source of each pair to provide down current pulses to offset error in the current response of the pairs of current sources.

8 Claims, 6 Drawing Sheets

CHOPPED CHARGE PUMP

RELATED APPLICATIONS

This application claims priority of U.S. Provisional Application No. 60/483,411 filed Jun. 27, 2003 and U.S. Provisional Application No. 60/544,439, filed Feb. 14, 2004, both incorporated by reference herein.

FIELD OF THE INVENTION

This invention relates generally to a charge pump and a phase frequency detector (PFD) typically employed in a phase lock loop (PLL) and more particularly to an improved chopped charge pump which generates matching current up and down pulses and an improved PFD which provides matched up and down pulse widths.

BACKGROUND OF THE INVENTION

PLL synthesizers typically include a PFD which compares the input reference frequency to a sub-multiple of the output frequency (e.g., divided by N with a digital divider). The PFD generates up and down pulses which are applied to the charge pump. A conventional tri-state PFD includes a pair of bi-stable devices (e.g., D-type flip-flops) and gating logic. Because there is mismatch in the clock-to-Q delay in the flip-flops as well as mismatch in the reset-to-Q delay, the up and down pulses have slightly mismatched pulse widths which leads to output offset error. Moreover, any mismatch in the propagation delays of the gating logic in the up and down paths between the PFD and the charge pump will cause an output offset which results in static phase error.

The current sources of the single-ended charge pump of conventional dual bandwidth PLL synthesizers typically utilize different types of devices for the pump up and pump down current sources in the charge pump, e.g., a PMOS device for up current pulses and an NMOS device for down current. Typically, the matching between the currents from the two different devices is no better than five percent. The result is mismatched up and down current pulse magnitudes, that the charge pump generates. The PLL structure that is commonly used in conventional synthesizers is a closed loop feedback system with two integrators in the forward path. Hence the PLL synthesizer will reach equilibrium with whatever static phase error the PLL synthesizer needs between the PFD inputs to ensure DC balance at the loop filter node connected to the charge pump output. The DC or average value of the static phase error will be the amount required to cancel out the excess charge delivered to the loop filter due to the mismatch. For example, a mismatch of 5% with a 3 ns minimum PFD turn-on time would result in a phase skew of about 150 ps between the PFD inputs. In this example, if the RF output frequency is about 1850 MHz, a phase skew of 150 ps would corresponds to a static phase error of 100° at the output. Similarly, other imperfections in the PFD and/or the conventional single-ended charge pump, such as charge injection in the charge pump switches and leakage current at the output, will result in static phase error at the output of the PLL.

A prior art PLL circuit which attempts to reduce 1/f noise generated by the charge pump is disclosed in U.S. Pat. No. 6,111,470, incorporated herein by reference. The chopper stabilization technique as disclosed in the '470 patent will reduce the 1/f noise component but the single-ended design is still prone to static phase error. The PLL of the '470 patent employs a single-ended charge pump with only one output terminal which relies on a current mirror circuit to provide matching current up and current down pulses. However, the inherent current losses in the current mirror circuit, as well as the difference in propagation delay between the direct path to the output and the path through the current mirror to the output, results in a mismatch in the amplitude as well as timing between the actual up and down current pulses at the output. Also, since the elements being chopped are not identical (one device is a current source only and the other device is a current source and a current mirror), the relatively high mismatch error being chopped will result in a high spur level at the chopping rate. Moreover, static phase error resulting from the switch charge injection and output leakage will not be reduced using the chopping technique and design as disclosed in the '470 patent.

A conventional differential charge pump may be employed in a PLL to improve the matching of the current up and down pulses. A typical differential charge pump attempts to match current sources of the same type, e.g., PMOS to PMOS and NMOS to NMOS, rather than PMOS to NMOS as in the single-ended charge pump described above. A typical differential charge pump utilizes a pair of PMOS and NMOS devices to generate up current pulses and another pair of PMOS and NMOS devices to generate down current pulses. However, the PMOS and NMOS devices of a differential charge pump have a residual mismatch due to process variations. Leakage, headroom, and die area set a limit on how much these variations can be reduced. Hence, conventional differential charge pumps employed in a PLL do not provide completely matched current up and current down pulses needed to eliminate static phase offset.

BRIEF SUMMARY OF THE INVENTION

It is therefore an object of this invention to provide an improved chopped charge pump which provides matched up and down output current pulses.

It is a further object of this invention to provide such an improved chopped charged pump which eliminates static phase offset.

It is a further object of this invention to provide an improved chopped PFD which provides matched up and down pulse widths.

It is a further object of this invention to provide such an improved chopped PFD with zero output offset.

It is a further object of this invention to provide an improved PLL which employs a chopped charge pump and a chopped PFD with zero static phase offset.

This The Applicants' claimed invention results from the realization that an innovative chopped charge pump with matching current up and down pulses can be achieved with first and second pairs of current sources and a switching circuit which switches, in a first phase, one current source of each pair of current sources to provide up current pulses and the other current source of each pair to provide down current pulses, then, in a second phase, switching the other current source of each pair to provide up current pulses and the one current source of each pair to provide down current pulses to remove mismatch errors in the current response of each of the pairs of current sources and eliminate static phase offset. This invention results from the further realization that an improved PFD with matching up and down pulses can be achieved with first and second bi-stable devices and a switching circuit that activates in a first phase the first bi-stable device to provide up pulses and the second bi-stable device to provide down pulses, then, in a second phase, activating the second bi-stable device to provide up pulses and the first bi-stable device to provide down pulses to remove mismatch in the propagation delays of the first and second of bi-stable devices and provide matched up and down pulse widths. As known to those skilled in the art, an up current pulse relates to a current flow that will source a current to a positive output or a current flow that will pull (sink) current from a negative output. A down current pulse relates to a current flow that will source a current to a negative output or a current flow that will sink current from a positive output.

This invention features a chopped charge pump with matching up and down pulses including a first pair of current sources, a second pair of current sources, and a switching circuit for switching on in a first phase, one current source of each pair to provide up current pulses and the other current source of each pair to provide down current pulses and switching on in a second phase, the other current source of each pair to provide up current pulses and the one current source of each pair to provide down current pulses to offset error in the current response of the pairs of current sources.

In one embodiment, the first pair of current sources are one polarity and the second pair of current sources are the opposite polarity. The first pair may include P-type devices and the second pair may include N-type devices. The P-type devices may be PMOS transistors. The N-type devices may be NMOS transistors. The switching circuit may include a plurality of switching devices responsive to a plurality of enabling signals for switching on the one current source of each pair and the other current source of each pair in the first phase and switching on the other current source of each pair and the one current source of each pair in the second phase.

This invention further features a phase lock loop with zero static phase offset including a phase frequency detector responsive to a reference frequency and a sub-multiple of an output frequency for providing up and down pulses, a chopped charge pump responsive to the up and down pulses including a first pair of current sources, a second pair of current sources, and a switching circuit for switching on in a first phase one current source of each pair to provide up current pulses and the other current source of each pair to provide down current pulses and switching on a second phase the other current source of each pair to provide up current pulses and one current source of each pair to provide down current pulses to remove mismatch errors in the current response of each of the pairs of current sources to eliminate static phase offset. A loop filter is responsive to the up and down current pulses for providing differential voltage signals. A differential to single-ended amplifier may be responsive to the differential voltage signals for providing single-ended voltage signals and a voltage controlled oscillator may be responsive to the single-ended voltage signals for increasing or decreasing the output signal frequency.

This invention also features a chopped phase frequency detector with matching up and down pulse inputs including first and second bi-stable devices responsive to a reference frequency and a sub-multiple of an output frequency, and a switching circuit for activating in a first phase the first bi-stable device to provide up pulses and the second bi-stable device to provide down pulses and activating in a second phase the second bi-stable device to provide up pulses and the first bi-stable device to provide down pulses to remove mismatch in the propagation delays of the first and second bi-stable devices and provide matched up and down pulse widths.

In one embodiment, the switching circuit may include a plurality of switching devices for activating the first and second bi-stable devices.

This invention further features a phase lock loop with zero static phase offset including a chopped phase frequency detector including first and second hi-stable devices responsive to a reference frequency and a sub-multiple of an output frequency, the chopped phase frequency detector may include a switching circuit for activating in a first phase the first hi-stable device to provide up pulses and the second hi-stable device to provide down pulses and activating in a second phase the second hi-stable device to provide up pulses and the first hi-stable device to provide down pulses to remove mismatch in the propagation delays of the first and second hi-stable devices and provide matched up and down pulse widths. A charge pump is responsive to the up and the down pulses for providing up and down current pulses. A loop filter is responsive to the up and down current pulses for providing differential voltage signals. A differential to single-ended amplifier may be responsive to the differential voltage signals and converts the differential voltage signals to single-ended voltage signals. A voltage controlled oscillator is responsive to the voltage signals for increasing or decreasing the output signal frequency. A frequency divider divides the output of the voltage controlled oscillator by a predetermined number to generate the sub-multiple of the output signal.

This invention also features a phase lock loop with zero static phase offset including a chopped phase frequency detector including first and second hi-stable devices responsive to a reference frequency and a sub-multiple of an output frequency. The chopped phase frequency detector may include a switching circuit for activating in a first phase the first bi-stable device to provide up pulses and the second bi-stable device to provide down pulses and activating in a second phase the second bi-stable device to provide up pulses and the first bi-stable device to provide down pulses to remove mismatch in the propagation delays of the first and second bi-stable devices and provide matched up and down pulse widths. A chopped charge pump may be responsive to the up and the down pulses and includes a first pair of current sources, a second pair of current sources, and a switching circuit for switching on in a first phase one current source of each pair to provide up current pulses and the other current source of each pair to provide down current pulses and switching on a second phase the other current source of each pair to provide up current pulses and the one current source of each pair to provide down current pulses to provide matching up and down current pulses to eliminate static phase offset. A loop filter is responsive to the up and down current pulses for providing differential voltage signals. A differential to single-ended amplifier may be responsive to the differential voltage signals and converts the differential voltage signals to single-ended voltage signals. A voltage controlled oscillator is responsive to the single-ended voltage signals for increasing or voltage controlled oscillator by a predetermined number to generate the sub-multiple of the output signal.

This invention also features a phase lock loop with zero static phase offset including a chopped phase frequency detector including first and second bi-stable devices responsive to a reference frequency and an output frequency. The chopped phase frequency detector may include a switching circuit for activating in a first phase the first bi-stable device to provide up pulses and the second bi-stable device to provide down pulses and activating in a second phase the second bi-stable device to provide up pulses and the first bi-stable device to provide down pulses to remove mismatch in the propagation delays of the first and second bi-stable devices and provide matched up and down pulse widths. A chopped charge pump may be responsive to up and down pulses and includes a first pair of current sources, a second pair of current sources, and a switching circuit for switching on in a first phase one current source of each pair to provide up current pulses and the other current source of each pair to provide down current pulses and switching on a second phase the other current source of each pair to provide up current pulses and the one current source of each pair to provide down current pulses to provide matching up and down current pulses to eliminate static phase offset. A loop filter is responsive to the up and down current pulses for providing differential voltage signals. A differential to single-ended ended amplifier may be responsive to the differential voltage signals and converts the differential voltage signals to single-ended voltage signals and a voltage controlled oscillator is responsive to the single-ended voltage signals for increasing or decreasing the output signal frequency.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
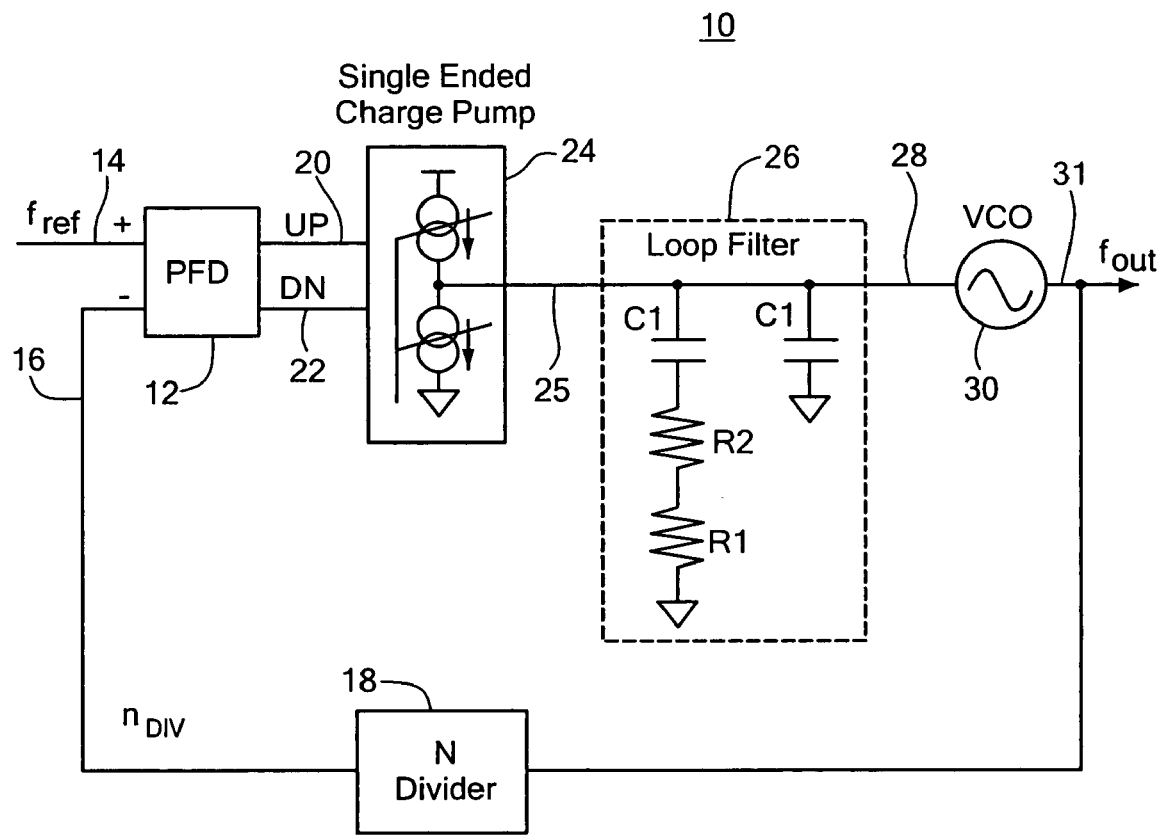
FIG. 1 is a schematic block diagram of a typical prior art PLL synthesizer employing a PFD which generates mismatched up and down pulses and a charge pump which generates mismatched current up and current down pulses.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Prior art PLL synthesizer 10, FIG. 1, typically includes phase frequency detector (PFD) 12 responsive to a reference frequency signal, $f_{REF}$, on line 14 and a sub-multiple of an output frequency signal, $f_{OUT}$, e.g., $n_{DIV}$ on line 16. Typically $n_{DIV}$ is generated with N-divider circuit 18 which divides $f_{OUT}$ by N. PFD 12 compares the frequency of $f_{REF}$ and $n_{DIV}$ to determine if the frequency of $n_{DIV}$ needs to be increased or decreased. In order to lock the frequency of $n_{DIV}$ to $f_{REF}$, PFD 12 generates up pulses on line 20 or down pulses on line 22 which is applied to charge pump 24. Charge pump 24, generates current up or current down pulses on line 25 which are applied to loop filter 26. Loop filter 26 generates voltages on line 28 which is applied to VCO 30. VCO 30 then increases or decreases the frequency of $f_{OUT}$ on line 31 which is input to N-divider circuit 18 to lock the frequency of $f_{REF}$ to $n_{DIV}$. As discussed above, prior art PFD 12 generates up and down pulses which have mismatched pulse widths that result in output phase offset and prior art charge pump 24 generates up and down output current pulses with mismatched magnitudes that also result in output phase offset.

Figure 2:
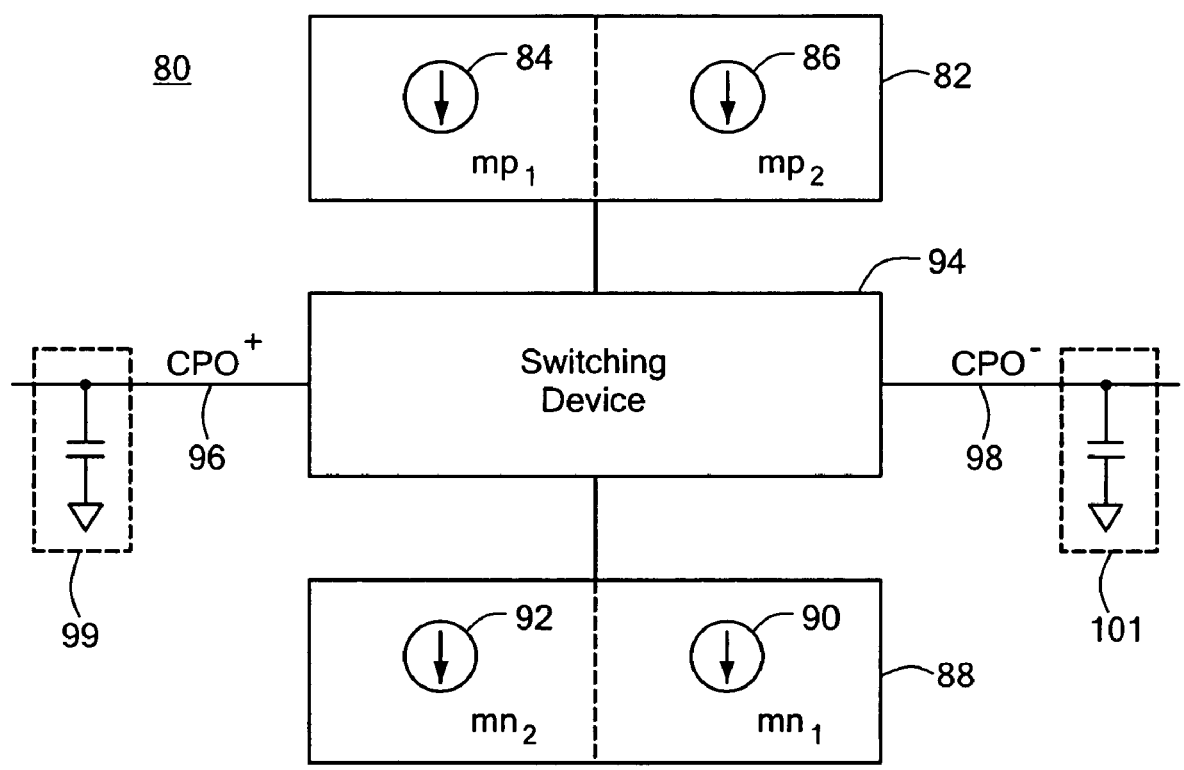
FIG. 2 is a schematic block diagram of one embodiment of the chopped charge pump of this invention.

In contrast, chopped charge pump 80, FIG. 2 of this invention includes first pair 82 of current sources 84 ($mp_1$) and 86 ($mp_2$), such as PMOS transistors, that source current out on line 96 to loop filter 99 and second pair 88 of current sources 90 ($mn_1$) and 92 ($mn_2$), such as NMOS transistors, that sink current in on line 98 from loop filter 101. The pump up operation increases the differential voltage between line 96 ($CPO^+$) and line 98 ($CPO^-$). Hence, up current is sourced out through line 96 ($CPO^+$) and sunk into line 98 ($CPO^-$). The pump down operation decreases (makes more negative) the differential voltage between line 96 ($CPO^+$) and line 98 ($CPO^-$). Hence, pump down current is sourced out through line 98 ($CPO^-$) and sunk into line 96 ($CPO^+$).

Switching circuit 94 switches on in a first phase, $\phi_1$, one current source of first pair 82 of current sources and second pair 88 of current sources, e.g., current source 84 ($mp_1$) and current source 90 ($mn_1$) to provide up current pulses on lines 96 and 98 and the other current source of first pair 82 and second pair 84, e.g., current source 86 ($mp_2$) and current source 92 ($mn_2$) to provide current down pulses on line 96 and 98. Then, in a second phase, $\phi_2$, switching circuit 94 switches on the other current source of pairs 82 and 88 to provide up and down current pulses, e.g., current source 86 ($mp_2$) of pair 82 and current source 92 ($mn_2$) of pair 84 to provide up current and current source 84 ($mp_1$) of pair 82 and current source 90 ($mn_1$) of pair 88 to provide down current. Table 1 below summarizes the various current sources activated in the first and second phases:

TABLE 1

|      | $\phi_1$ | $\phi_2$ |
|------|----------|----------|
| up   | $mp_1$   | $mp_2$   |
|      | $mn_1$   | $mn_2$   |
| down | $mp_2$   | $mp_1$   |
|      | $mn_2$   | $mn_1$   |

By selectively alternating the up and down current sources which provide the up current and down current pulses matched current up and current down pulses are generated by chopped charge pump 80 over two phases which eliminates the corresponding need for compensating static phase offset in the PLL.

As discussed above, differential charge pump 80 utilizes a pair of PMOS and NMOS devices to generate up current pulses (e.g., current sources 84 and 90) and another pair of PMOS and NMOS devices (e.g., current sources 86 and 92) to generate down current pulses. The up versus down mismatch problem is now significantly reduced because it depends on how a PMOS device matches a PMOS device and an NMOS device matches an NMOS device. Utilizing a fully differential architecture of differential charge pump 80 with identical up and down current sources reduces the mismatch by at least an order of magnitude when compared to conventional single-ended charge pumps. The addition of the chopping technique as described above to the differential structure of differential charge pump 80 eliminates any residual mismatch that may still exist between the two identical halves (e.g. one identical half including current sources 84 and 90 and the one identical half consisting of current sources 86 and 92) of differential charge pump 80 due to process variations. Moreover, the design of differential charge pump 80 results in switch charge injection and output leakage that are both common mode to the differential output signal. Because the switches (discussed below) connected to line 96 (CPO$^+$) are identical in size and layout structure to the switches connected to line 98 (CPO$^-$), any differential leakage current or charge injection component will typically be negligibly small. Moreover, because current sources of identical structure are being chopped the mismatch error being chopped is small and thus the spur at the chopping rate will be small. This is a particularly important advantage when used in a fractional-N PLL using sigma-delta noise shaping because a large spur at the chopping rate would result in quantization noise components close to the chopping frequency being mixed down inside the loop bandwidth.

Figure 3:
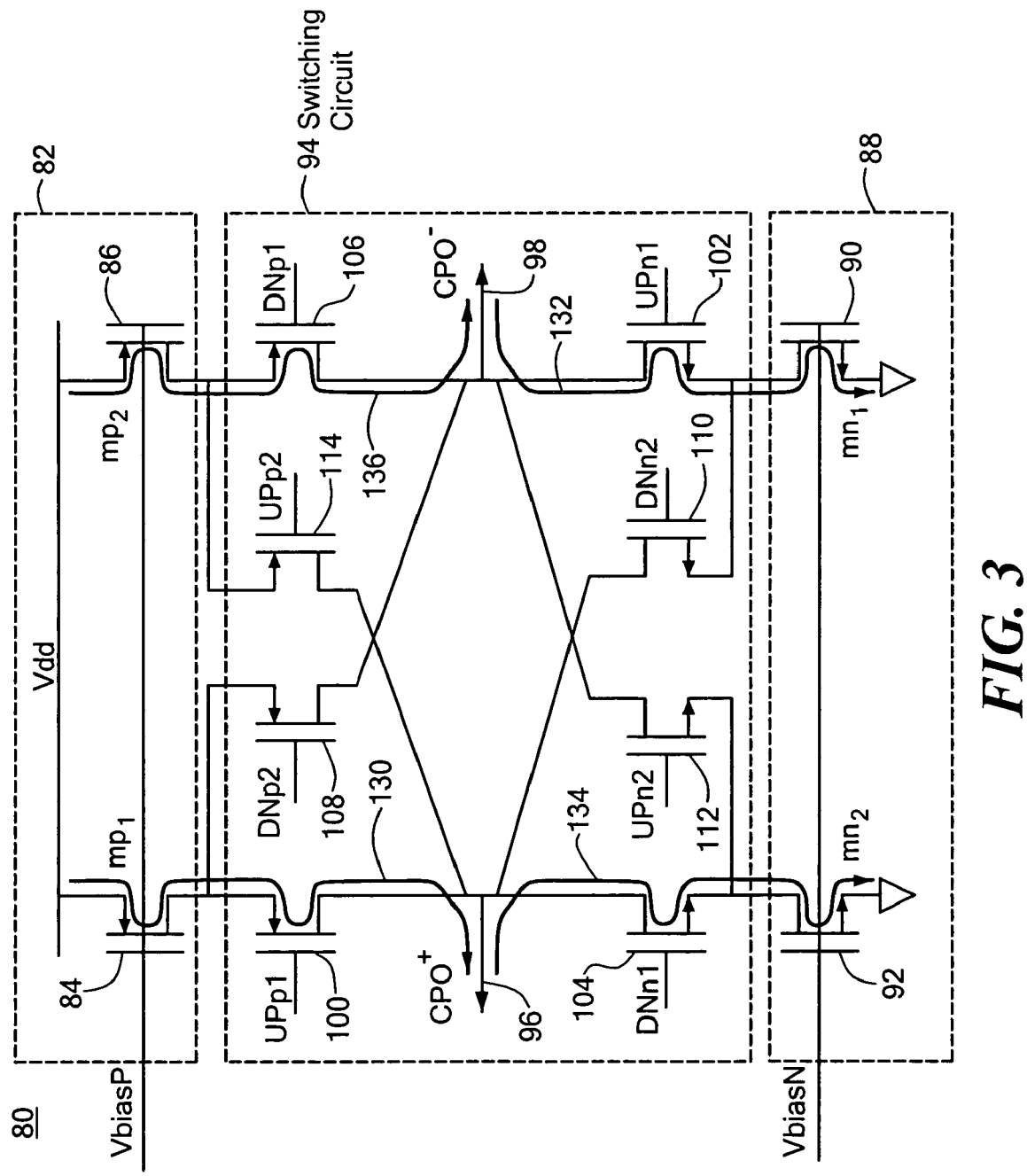
FIG. 3 is a schematic block diagram showing in further detail the switching devices used to switch the current sources shown in FIG. 2 in the first phase in accordance with this invention.
Figure 4:
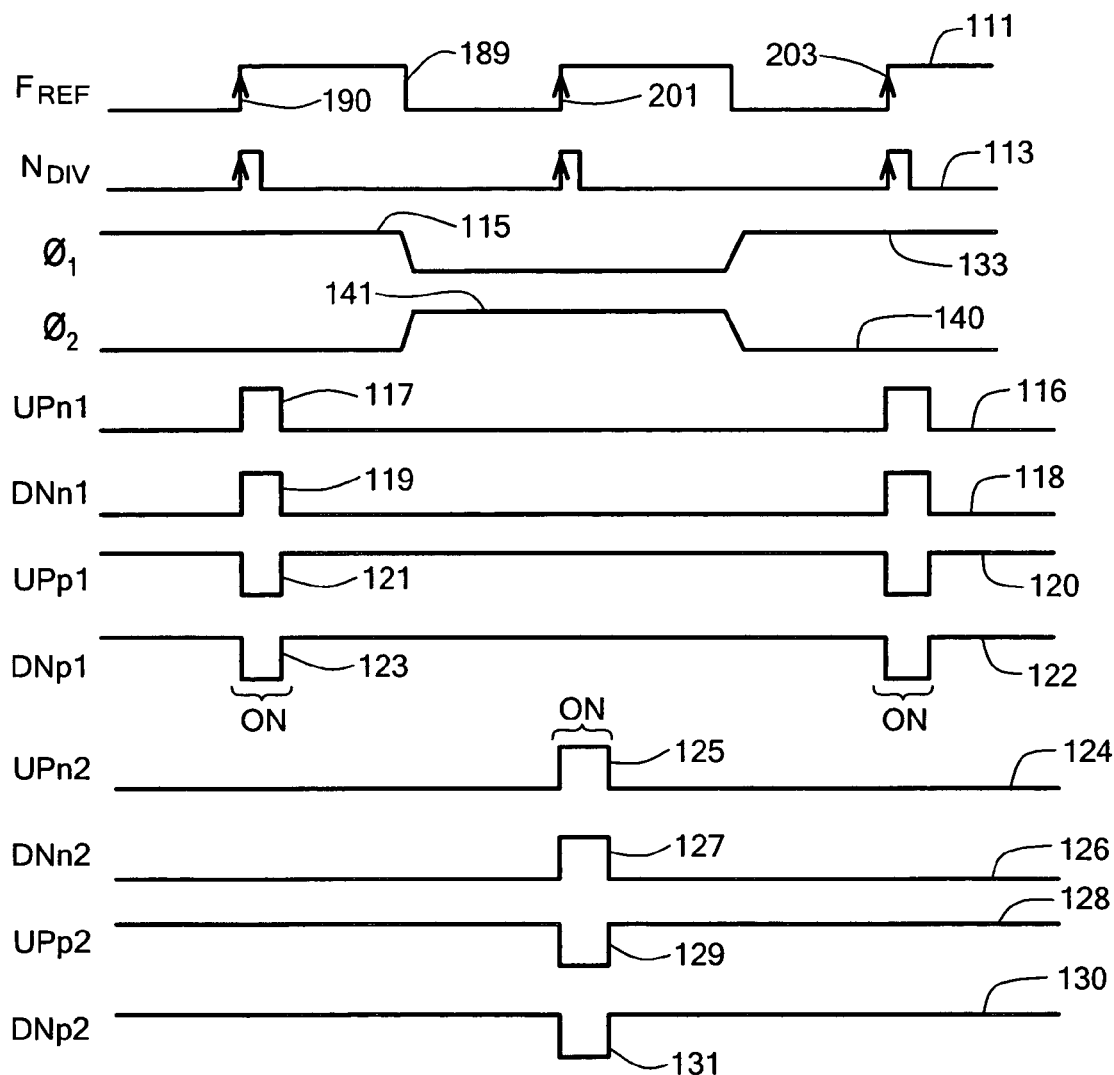
FIG. 4 is a timing diagram showing the various enable signals used to drive the switching devices shown in FIG. 3.

Switching circuit 94, FIG. 3 typically includes a plurality of switching devices, such as switching devices 100, 102, 104, 106, 108, 110, 112, and 114 responsive to a plurality of enabling signals, such as UPn1 signal 116, FIG. 4, DNn1 signal 118, UPp1 signal 120, DNp1 signal 122, UPn2 signal 124, DNn2 signal 126, UPp2 signal 128 and DNp2 signal 130. Switching devices 100–114, FIG. 3 are enabled by enabling signals 116–130, FIG. 4, as discussed in detail below, to switch current sources 84 and 86 of pair 82 and current sources 90 and 92 of pair 88 as described in detail below.

Figure 5:
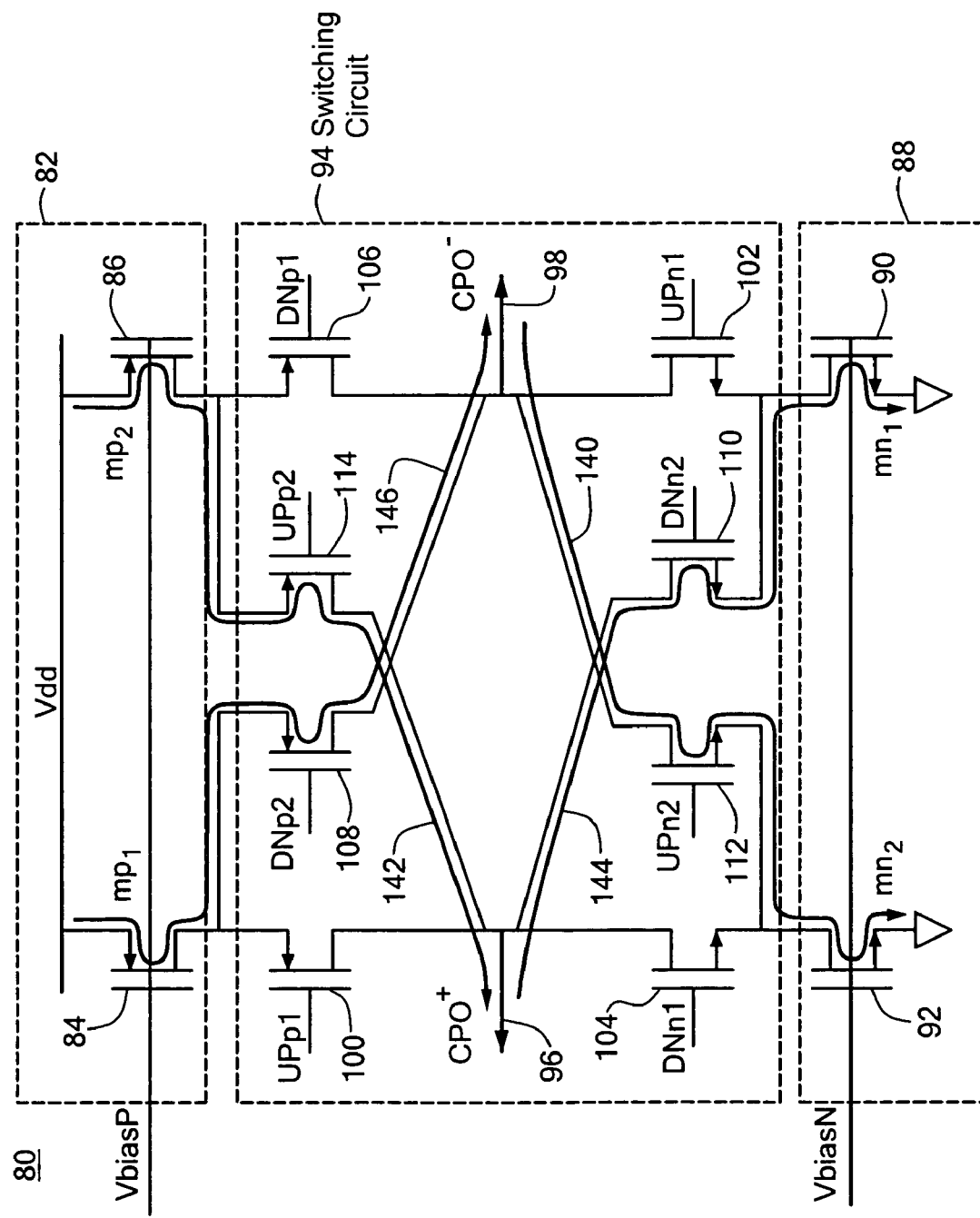
FIG. 5 is a schematic block diagram similar to FIG. 3 showing the current sources and switch devices enabled in the second phase in accordance with this invention.

The operation of switching circuit 94 is explained with reference to FIGS. 3, 4, and 5. In phase $\phi_1$, e.g., when $\phi_1$ signal 133, FIG. 4, is high, as indicated at 115, pulse 117 of UPn1 signal 116 enables switching device 100, FIG. 3, so that current source 84 generates an up current pulse on line 96, as indicated by arrow 130. Typically $\phi_1$ signal 133 is generated with a bi-stable device (not shown), such as a toggle flip-flop clocked at the PFD reference rate or some integer sub-multiple of this rate. This is shown toggling at the reference rate by the falling edge of $f_{REF}$ signal 111, FIG. 4, (e.g. falling edge 189) with the rising edges (e.g., rising edges 190, 201 and 203) of $f_{REF}$ signal 111 being the active edge at the PFD to generate UPn1 signal 116, DNn1 signal 118, UPp1 signal 120, DNp1 signal 122, UPn2 signal 124, DNn2 signal 126, UPp2 signal 128 and DNp2 signal 130. $\phi_1$ signal 133 could be derived from any signal at the reference rate as long as it is generated with sufficient setup time before the PFD is active and sufficient hold time after the PED is active.

Similarly to UPn1 signal 116, pulse 121 of UPp1 signal 120, enables switching device 102 so that current source 90 generates an up current pulse on line 98, as indicated by arrow 132. Similarly, in $\phi_1$, pulse 119 of DNn1 signal 118 enables switching device 104 such that current source 92 provides a down current pulse on line 96, as indicated by arrow 134. Pulse 123 of DNp1 signal 122 enables switching device 106 so that current from current source 86 generates a down current pulse on line 98, as indicated by arrow 136. In the second phase, $\phi_2$, which is active while $\phi_2$ signal 140 is high, as indicated at 141, pulse 125 of UPn2 signal 124 enables switching device 112, FIG. 5, so that current source 92 generates an up current pulse on line 98, as indicated by arrow 140. $\phi_2$ signal 140 is generated by similar techniques as $\phi_1$ signal 133 described above. Similarly, pulse 129 of UPp2 signal 128 enables switching device 114 so that current source 86 generates an up current pulse on line 96, as indicated by arrow 142. Pulse 127 of DNn2 signal 126 enables switching device 110 such that current source 90 generates a down current pulse on line 96, as indicated by arrow 144. Finally, pulse 131 of DNp2 signal 130 enables switching device 108 so that current source 84 generates a down current pulse on line 98, as indicated by arrow 146. The result, over two phases, is that matching up and down current pulses are generated by chopped charge pump 80 which, as discussed above, eliminates the need for the PLL to generate a static phase offset to compensate for charge pump mismatch.

As discussed above, prior art PFDs provide up and down pulses which have mismatched pulse widths which result from mismatch in propagation delays in both the clock-to-Q delay and reset-to-Q delay paths between the pair of flip-flop devices typically employed in the PFD.

Figure 6:
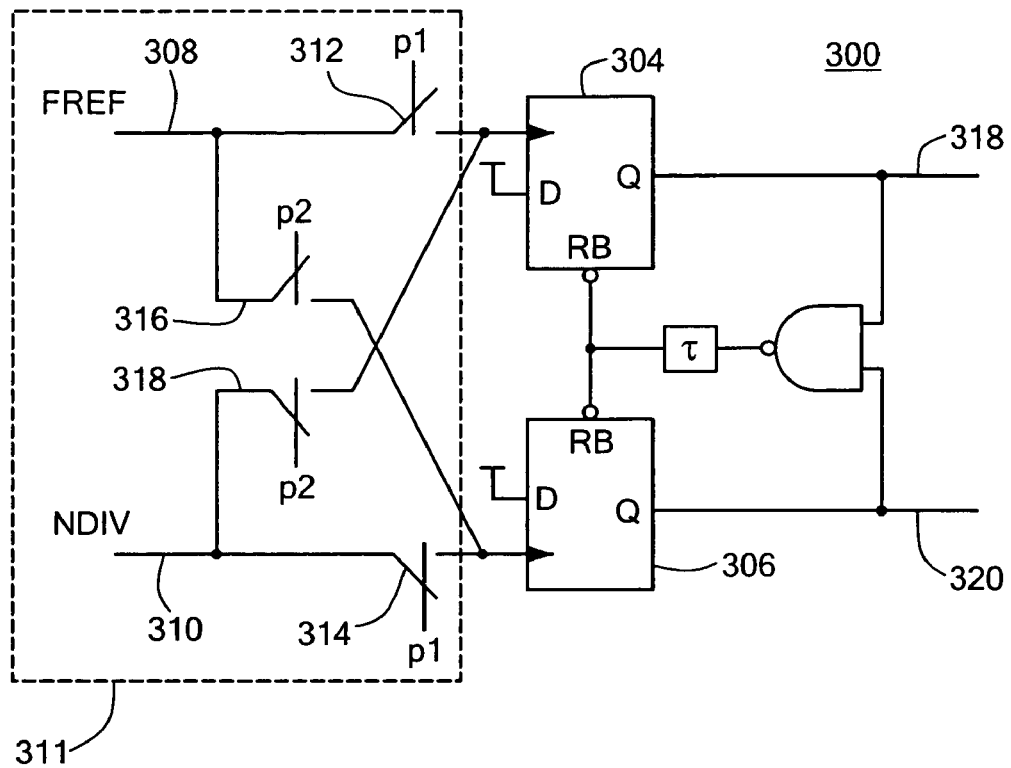
FIG. 6 is a schematic block diagram of one embodiment of the chopped phase frequency detector with matching up and down pulses of this invention.

In contrast, chopped phase frequency detector 300, FIG. 6, of this invention, with matching up and down pulses, includes first and second bi-stable devices 304 and 306, e.g., D-type flip-flops, responsive to input reference signal $f_{REF}$ on line 308 and a sub-multiple of the output signal $n_{DIV}$ on line 310. Switching circuit 311 switches on in the first phase, $\phi_1$, switches 312 and 314 which routes the reference signal, $f_{REF}$ on line 308 to bi-stable device 304 to provide up pulses on line 318 and routes the sub-multiple of the reference signal, $N_{DIV}$, on line 310 to bi-stable device 306 to provide down pulses on line 320. Switching device 311 then switches on in the second phase, $\phi_2$, switches 316 and 318 to route the reference signal, $f_{REF}$ on line 308 to bi-stable device 306 to provide up pulses on line 320 and routes the sub-multiple of the reference signal, $N_{DIV}$, on line 310 to bi-stable device 304 to provide down pulses on line 318. Phases $\phi_1$ and $\phi_2$ are generated similar to $\phi_1$ phase signal 133, FIG. 4, and $\phi_2$ signal 140.

The result is that chopped phase frequency detector 300 provides matched total up and total down pulse widths over two phases. This removes the problems associated with mismatch in propagation delays in the first of bi-stable devices 304 and 306 and results in zero output offset.

Figure 7:
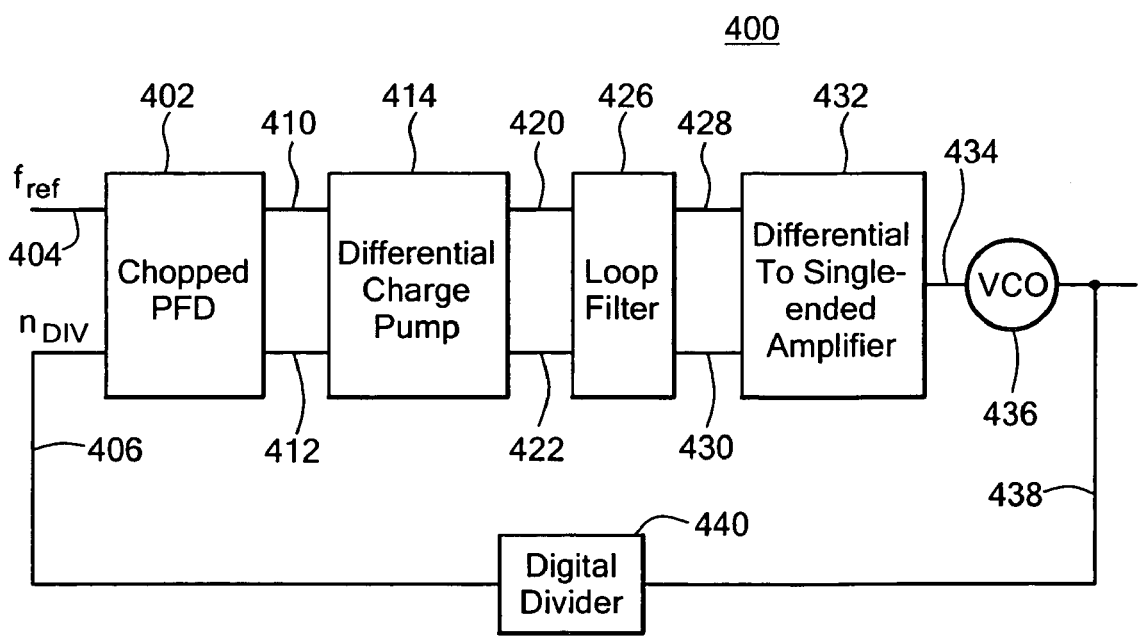
FIG. 7 is a schematic block diagram of one embodiment of the phase lock loop synthesizer with zero static phase error of this invention employing the chopped phase frequency detector shown in FIG. 6 and the chopped charge pump shown in FIGS. 2, 3, and 5.

Phase lock loop 400, FIG. 7, of this invention with zero static phase error, includes chopped phase frequency detector 402 of similar design as chopped phase frequency detector of this invention as described above, responsive to a reference frequency signal, $f_{REF}$, on line 404 and a sub-multiple of an output frequency signal, $f_{OUT}$, e.g., $n_{DIV}$ on line 406. The sub-multiple of the output frequency signal, four, may be an integer sub-multiple or a fractional sub-multiple. As discussed above, chopped PFD 402 provides matched up and down pulses with matched pulse widths on lines 410 and 412 with zero output offset which are applied to chopped charge pump 414, of similar design as the chopped charge pump of this invention, described above. Chopped charge pump 414 generates a matched current up and current down pulse over two phases on lines 420 and 422. Both of these improvements dynamically eliminate mismatch through chopping, and eliminate the need for the PLL to develop a static phase offset. Loop filter 426 is responsive to the matched current up and current down pulses to generate voltages on lines 428 and 430 which are applied to differential to single-ended amplifier 432 which converts the differential voltage between lines 428 and 430 to a single-ended voltage on line 434 which is applied to VCO 430. Further details regarding the use of a differential charge pump, and converting the differential voltages generated by the loop filter to a single-ended voltage are disclosed in co-pending application Ser. No. 10/874.603 filed Jun. 23, 2004, published as US 2005/0057313 A1 on Mar. 17, 2005, by the inventive entity hereof entitled "Differential Charge Pump Phase Lock Loop (PLL) Synthesizer with Adjustable Tuning Voltage Range". VCO 436 increases or decreases the frequency of $f_{OUT}$ on line 438 which is input to N-divider circuit 440 in order to lock the frequency of $f_{REF}$ to $n_{DIV}$. Although in this example, phase lock loop 400 includes chopped phase frequency detector 402 and chopped charge pump 414, this is not a necessary limitation of this invention, as phase lock loop 400 may include chopped charge pump 414 with a conventional phase frequency detector or chopped phase frequency detector 402 with a conventional differential charge pump.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

What is claimed is:

1. A chopped charge pump with matching up and down pulses comprising:
    a first pair of current sources;
    a second pair of current sources; and
    a switching circuit for switching on in a first phase one current source of each said pair to provide up current pulses on first and second outputs of the charge pump and the other current source of each said pair to provide down current pulses on the first and second outputs, and switching on in a second phase said other current source of each said pair to provide up current pulses on the first and second outputs and said one current source of each said pair to provide down current pulses on the first and second outputs to remove mismatch errors in the current response of each of said pairs of current sources.

2. The chopped charge pump of claim 1 in which said first pair of current sources has one polarity and said second pair of current sources has the opposite polarity.

3. The chopped charge pump of claim 1 in which said first pair includes P-type devices and said second pair includes N-type devices.

4. The chopped charge pump of claim 3 in which said P-type devices are PMOS transistors.

5. The chopped charge pump of claim 3 in which said N-type devices are NMOS transistors.

6. The chopped charge pump of claim 1 in which said switching circuit includes a plurality of switching devices responsive to a plurality of enabling signals for switching on said one current source of each said pair and said other current source of each said pair in said first phase and switching on said other current source of each said pair and said one current source of each said pair in said second phase.

7. A phase lock loop with zero static phase offset comprising:
    a phase detector circuit, responsive to a reference frequency and a sub-multiple of an output frequency, for generating up and down pulses;
    a chopped charge pump responsive to said up and down pulses including:
        a first pair of current sources;
        a second pair of current sources; and
        a switching circuit for switching on in a first phase one current source of each said pair to provide up current pulses on first and second outputs of the charge pump and the other current source of each said pair to provide down current pulses on the first and second outputs, and switching on in a second phase said other current source of each said pair to provide up current pulses on the first and second outputs and said one current source of each said pair to provide down current pulses to provide matching up and down current pulses on the first and second outputs to remove mismatch errors in the current response of each of said pairs of current sources to eliminate static phase offset;
    a loop filter responsive to said up and down current pulses for providing differential voltage signals;
    a differential to single-ended amplifier responsive to said differential voltage signals for providing single-ended voltage signals;
    a voltage controlled oscillator responsive to said single-ended voltage signals for increasing or decreasing said output frequency; and
    a frequency divider for dividing the output frequency by a predetermined number to generate said sub-multiple of said output frequency.

8. A phase lock loop with zero static phase offset comprising:
    a phase detector circuit, responsive to a reference frequency and an output frequency, for generating up and down pulses;
    a chopped charge pump responsive to said up and down pulses including:
        a first pair of current sources;
        a second pair of current sources; and
        a switching circuit for switching on in a first phase one current source of each said pair to provide up current pulses on first and second outputs of the charge pump and the other current source of each said pair to provide down current pulses on the first and second outputs, and switching on in a second phase said other current source of each said pair to provide up current pulses on the first and second outputs and said one current source of each said pair to provide down current pulses to provide matching up and down current pulses on the first and second outputs to remove mismatch errors in the current response of each of said pairs of current sources to eliminate static phase offset;

a loop filter responsive to said up and down current pulses for providing differential voltage signals;

a differential to single-ended amplifier responsive to said differential voltage signals for providing single-ended voltage signals; and a voltage controlled oscillator responsive to said single-ended voltage signals for increasing or decreasing said output frequency.

* * * * *